United States Patent

Salmon

Patent Number: 5,323,916
Date of Patent: Jun. 28, 1994

[54] UNEQUAL FLANGE-TYPE TELEPHONE EQUIPMENT RACK ADAPTED FOR UNIVERSAL APPLICATION

[75] Inventor: Garland R. Salmon, Durham, N.C.

[73] Assignee: Newton Instrument Company, Inc., Butner, N.C.

[21] Appl. No.: 995,751

[22] Filed: Dec. 23, 1992

[51] Int. Cl.[5] ............................................. A47F 5/00
[52] U.S. Cl. ....................................... 211/26; 211/189
[58] Field of Search .......................... 211/26, 191, 189; 361/415, 428, 429

[56] References Cited

U.S. PATENT DOCUMENTS

| | | | |
|---|---|---|---|
| 3,905,483 | 9/1975 | Patrick | 211/177 |
| 4,371,083 | 1/1983 | Zingrini et al. | 211/26 |
| 4,496,057 | 1/1985 | Zenitani et al. | 211/26 |
| 4,497,411 | 2/1985 | DeBortoli | 211/26 |
| 4,553,674 | 11/1985 | Yoshikawa et al. | 211/26 |
| 4,641,754 | 2/1987 | Hebel et al. | 211/26 |
| 4,662,524 | 5/1987 | Fullenkamp et al. | 211/190 |
| 4,715,502 | 12/1987 | Salmon | 211/26 |
| 4,979,909 | 12/1990 | Andrews | 439/352 |
| 4,988,008 | 1/1991 | Blum et al. | 211/189 |
| 5,004,107 | 4/1991 | Sevier et al. | 211/26 |
| 5,165,770 | 11/1992 | Hahn | 211/26 X |

OTHER PUBLICATIONS

Catalog published by Hendry Telephone Products, "Unequal Flange Cable Duct Bell Earthquake Assembly-Guard Box on Rear Narrow Flange", p. 10.
Catalog No. 9 published by Newton Instrument Company, Inc., "Unequal Flange Equipment Racks", Issue 14, FIG. 4099 (1986).

Primary Examiner—Robert W. Gibson, Jr.
Attorney, Agent, or Firm—Richard E. Jenkins

[57] ABSTRACT

A universal application unequal flange telephone equipment rack is provided to obviate the need for open and closed duct network bays and open and closed duct unequal flange equipment racks. The universal rack is constructed of a pair of upright frame members which are joined by a first pair of horizontal frame members at the top thereof and a second pair of horizontal frame members at the bottom thereof. The upstanding frame members are formed from identical metal channels having a U-shaped cross-section comprising a web with one relatively short side portion and another relatively long side portion wherein the web and side portions of each upright frame member are directed outwardly relative to the other frame member. Each pair of horizontal frame members is formed from identical C-shaped metal channels which are spaced apart so as to define a slot therebetween. The symmetrical construction of the equipment rack allows for different applications including use as either a front or rear access rack merely by inverting the rack.

7 Claims, 6 Drawing Sheets

UNEQUAL FLANGE-TYPE TELEPHONE EQUIPMENT RACK ADAPTED FOR UNIVERSAL APPLICATION

DESCRIPTION

1. Technical Field

The present invention relates to racks for mounting telephone equipment and more specifically to unequal flange-type racks for mounting telephone equipment

2. Related Art

Telephone equipment bays or racks for mounting communication equipment and apparatus have conventionally been used in controlled environment vaults as well as in telephone central offices and remote switch buildings. As is also well known to those skilled in the art, the bays or racks have conventionally been constructed of aluminum or steel which is bolted or welded together to provide the necessary size and strength to accommodate the intended end use in the controlled environment vault (CEV), telephone central office, remote switch building or the like.

Conventional bays or racks are quite large and unwieldy since they were designed years ago when all telephone wiring was copper and most of the telephone switches were electro-mechanical. This required that the bays or racks that were used in the telecommunications industry be constructed so as to handle the heavy equipment and overhead copper wire configuration. Thus, the conventional bays or racks were used as structural columns, and the large size of the mechanical equipment carried thereby necessitated the common use of very tall racks or bays. In fact, 11.50 feet was a typical bay or rack height. However, with the recent development of relatively small fully electronic switches and fiber optic transmission cable, the need for a tall and heavily constructed bay or rack is no longer necessary in most applications. For example, the common height is about 7 or 8 feet for a telephone equipment bay or rack now that the loads carried by the bays or racks are significantly lighter.

Although the bays or racks are now smaller and lighter in view of modern switches and fiber optic cable, there is still a requirement for a telecommunications company to utilize essentially four (4) different types of bay or rack configurations in order to fully meet the needs of a modern CEV, central office or remote switching building. Specifically the bays or racks presently known and used in the telecommunications field include the following basic configurations:

1. Network bay open duct;
2. Network bay closed duct;
3. Unequal flange equipment rack open duct; and
4. Unequal flange equipment rack closed duct.

Generally speaking, unequal flange equipment racks are very similar to network bays except for the fact that network bays have a lower bottom profile than do unequal flange equipment racks. Originally, telecommunications companies used unequal flange equipment racks, but they later also began using network bays which provided for extra mounting space by virtue of the aforementioned lower bottom profile or base assembly Typically, rear wired equipment is positioned in closed duct network bays and unequal flange equipment racks whereas front-wired equipment is positioned in open duct network bays and unequal flange equipment racks. As can be appreciated, the multiplicity of bays or racks required to accommodate the different types of telecommunications equipment mounted therein requires very detailed advance planning and ordering to assure that the right type of bays and/or racks are available.

Thus, it would be desirable to have a single universal rack which could be used by a telecommunications company in lieu of the four known different types of bay and rack configurations so as to obviate the necessity for the aforesaid advance planning and ordering. Applicant has now invented just such a universal rack which is interchangeable between open and closed duct uses and which may be substituted for any and all of the previously required four basic types of bay and rack configurations to meet the needs of a telecommunications company when constructing a CEV, telephone central office, remote switch building or the like.

Applicant's novel universal rack has been designed to accept and mount all known electronic equipment that is normally mounted in open duct or closed duct unequal flange equipment racks or network bays. The new universal rack is much lighter than previously utilized bays and racks, and meets a long-felt need in the telecommunications industry for reducing the different types of bays and racks required for mounting telecommunications equipment.

DISCLOSURE OF THE INVENTION

In accordance with the present invention, applicant provides a new unequal flange-type telephone equipment rack designed specifically for universal application in the telecommunications industry to obviate the need for the heretofore utilized proliferation of different bay and rack equipment The rack comprises a pair of upstanding spaced-apart frame members formed of metal channel wherein each of the frame members defines an upper and a lower end and wherein each of the metal channels further defines a U-shaped cross-section comprising a web having a relatively short side portion and a relatively long side portion. The bottom and side portions of each of the metal channels are directed outwardly relative to the bottom and side portions of the other of the metal channels.

A first pair of horizontal frame members is secured at opposing ends to the upper ends of the upstanding spaced-apart frame members, and the first pair of horizontal frame members are spaced apart to define a slot therebetween. A second pair of horizontal frame members are secured at opposing ends to the lower ends of the upstanding spaced-apart frame members, and the second pair of horizontal frame members are spaced apart to define a slot therebetween.

The upstanding spaced-apart frame members are formed of two identical pieces of metal channel, and the first pair and second pair of horizontal frame members are also formed of identical pieces of metal channel to simplify construction of the novel equipment rack of the invention. Thus, the rack is formed from four identical pieces of cross-bar metal channel and two identical pieces of upright metal channel so as to provide a rack which is interchangeable between open and closed duct usage by merely turning the rack upside down. This can be accomplished due to the universal design of the rack with an identical low profile top and bottom portion. This construction is in contrast to, for example, conventional unequal flange racks which incorporate a relatively high profile bottom portion having a guard box secured to the front thereof.

By contrast, applicant's novel universal equipment rack is provided as a single basic item wherein individual options can be attached by the customer to fit the specific needs and wants of the customer. With the flexibility provided by the on-site installed options to applicant's novel universal equipment rack, it is very inexpensive and relatively easy to make both upgrades and/or retrofits when using the novel bay or rack. All prior art bays and racks presently known require the purchase of an entire new bay or rack in order to make an upgrade and/or retrofit to existing equipment in a CEV, telephone central office, remote switch building or the like.

Some of the objects of the invention having been stated hereinabove, other objects will become evident as the description proceeds, when taken in connection with the accompanying drawings as best described hereinbelow.

BEST MODE FOR CARRYING OUT THE INVENTION

Figure 1A:
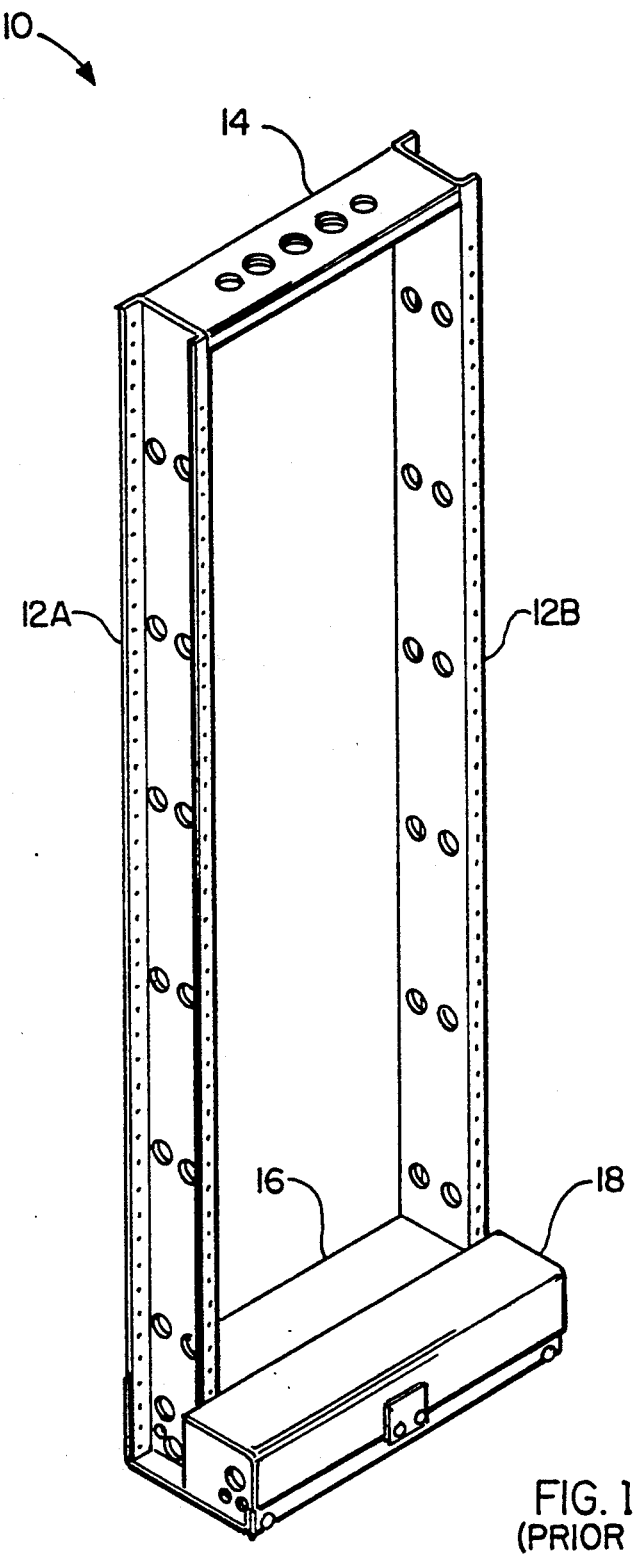
FIG. 1A is a perspective view of a prior art unequal flange-type telephone equipment rack.

As shown in FIG. 1A for better understanding of the present invention, a prior art unequal flange equipment rack (open duct) for mounting telecommunications equipment is shown and generally designated 10. Telephone equipment rack 10 is constructed from two upright metal channels 12A, 12B joined by a horizontal metal channel Cross bar 14 at the top and by a raised metal channel cross bar 16 at the bottom thereof to which a guard box 18 is attached by suitable screws (not shown). This type of open duct unequal flange equipment rack is used for mounting frontwired equipment and apparatus thereto in a manner well known in the telecommunications industry.

Rack 10 is not interchangeable With a closed duct rack (not shown) or, in most circumstances, an open duct network bay (shown in FIG. 1B) or a closed duct network bay (not shown). Thus, rack 10 must typically be stocked along with the other three types of racks by a telecommunications company or the like in order to have a suitable inventory of racks to change or upgrade a CEV, telephone central office and/or remote switching building in an efficient and timely fashion. The shortcomings of this type of rack and the other conventional racks presently known in the industry have been described in some detail hereinabove.

Figure 1B:
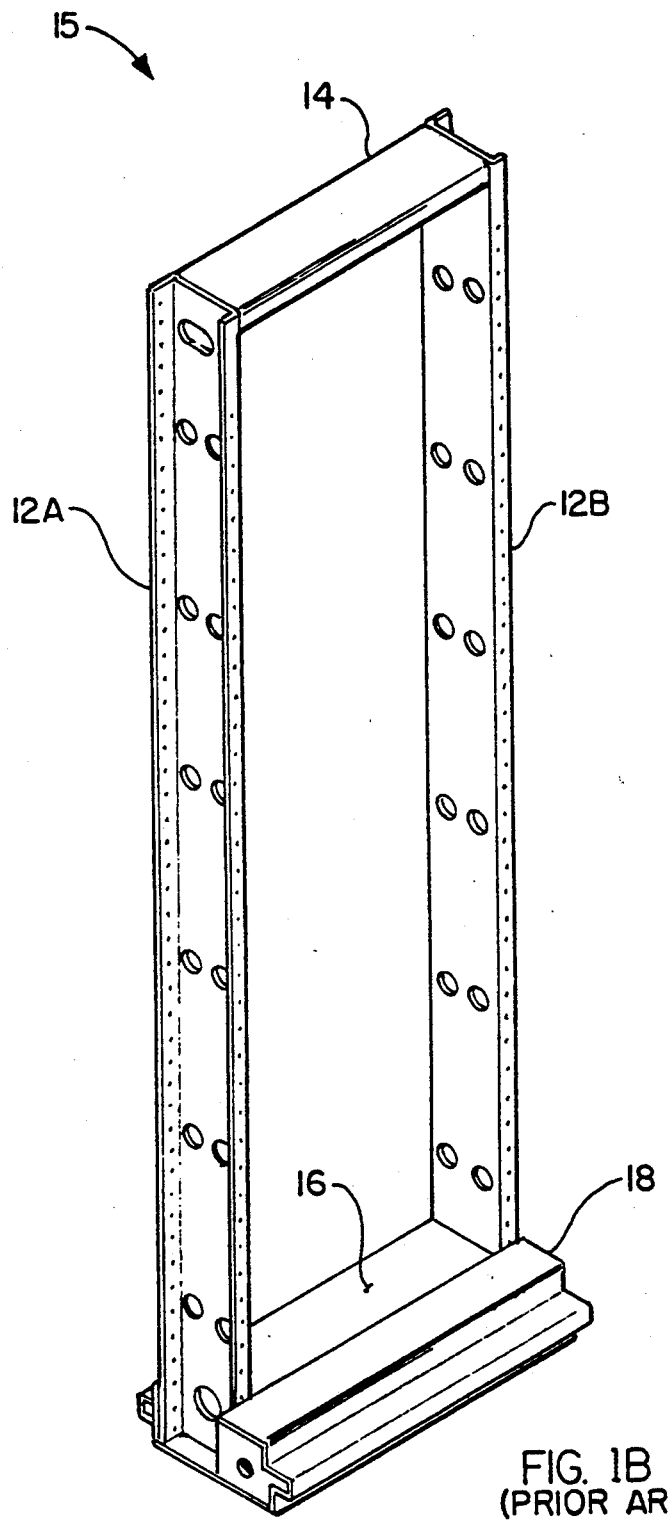
FIG. 1B is a perspective view of a prior art network bay.
Figure 2:
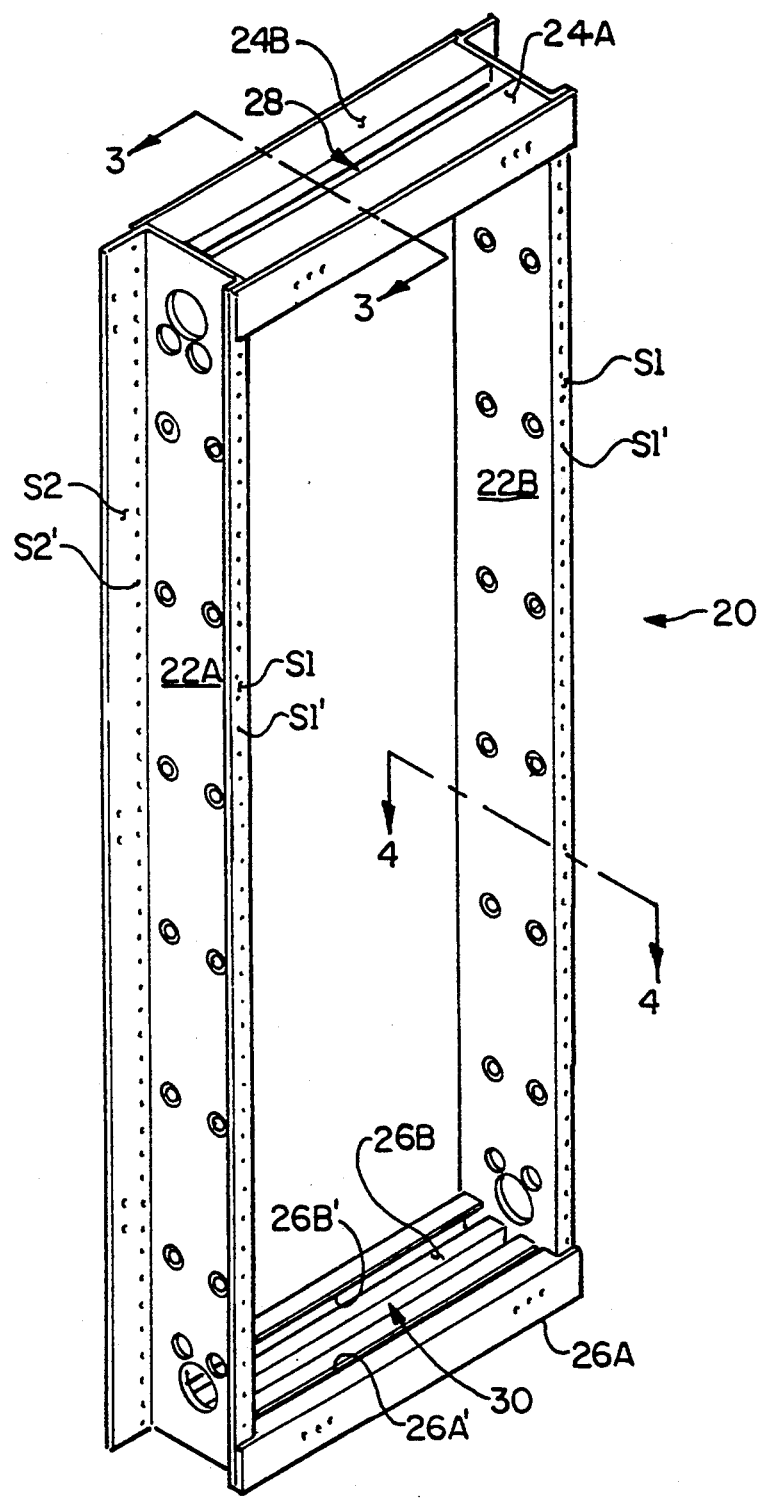
FIG. 2 is a perspective view of an improved unequal flange-type telephone equipment rack constructed in accordance with the present invention.

FIG. 1B illustrates a prior art network bay (open duct) for mounting telecommunications equipment and which is generally designated 15. The illustration of prior art network bay 15 uses the same numerals for similar elements thereof as the FIG. 1A unequal flange equipment rack. As can be appreciated with reference to FIG. 1B, network bay 15 is constructed substantially identically to prior art unequal flange equipment rack 10 except for the use of a lower metal base assembly 16 at the bottom thereof which includes a guard box 18 of a slightly different configuration. The lower bottom profile or base assembly of network bay 15 vis-a-vis unequal flange equipment rack 10 provides for extra mounting space for selected telephone equipment.

Referring next to FIGS. 2-7, the universal unequal flange telephone equipment rack of the invention is generally designated 20 and will now be described in detail. Rack 20 of the invention comprises a pair of upstanding frame members 22A, 22B which are joined together by a first pair of horizontal frame members 24A, 24B at the top thereof and a second pair of horizontal frame members 26A, 26B at the bottom thereof. The first and second pair of horizontal frame members, 24A, 24B and 26A, 26B, respectively, are most suitably joined to upstanding frame members 22A, 22B by welding although other means of attachment such as bolts could be utilized as a matter of design choice.

Figure 4:
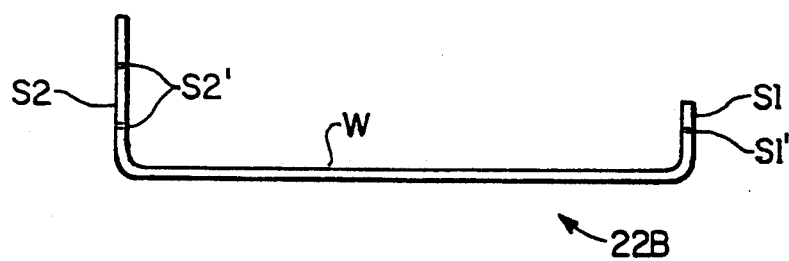
FIG. 4 is a cross-sectional view taken along the lines 4—4 of FIG. 1 illustrating the construction of one of the pair of upright metal channels of the rack (wherein the other upright metal channel is of identical construction).

Frame members 22A, 22B are each formed of a single bent metal channel piece having a cross-section as shown in FIG. 4 comprising a web W and short side S1 and long side S2 which form short and wide flanges, respectively. Flanges S1 and S2 of metal channel piece 22B are drilled and tapped to form apertures S1' and S2', respectively, so that selected telecommunication equipment may be mounted by screws thereto (screws not shown). Upstanding frame member 22A is identical in size and configuration to frame member 22B and is also formed with web W and short flange S1 and relatively long flange S2 with corresponding apertures S1' and S2' drilled and tapped therein.

Figure 3:
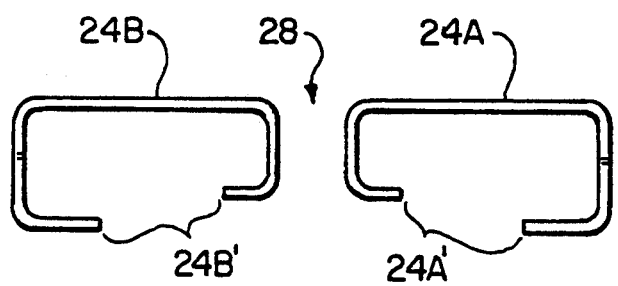
FIG. 3 is a view taken along the lines 3—3 of FIG. 2 illustrating the construction of the horizontal upper metal channels of the rack (wherein the lower metal channels are of identical construction).

Horizontal frame members 24A, 24B are each formed of a single C-shaped bent channel piece as best shown in FIG. 3. Channel pieces 24A, 24B define a slot 28 therebetween which serves to allow for flexibility in the placement of a mounting hole or threaded rod therethrough that will fit easily other items adjacent to rack 20. Still referring to FIG. 3, it can be further seen that C-shaped metal channel pieces 24A, 24B each define a lengthwise slot 24A' and 24B', respectively, in the bottom surface thereof to which mounting hardware may be secured in a manner which would be well known to one skilled in the telephone equipment rack art. Similarly, lower horizontal frame members 26A, 26B are spaced apart so as to form a slot 30 therebetween, and C-shaped bent metal channel pieces 26A, 26B also each define a lengthwise slot 26A' and 26B', respectively, along the length of the top surface thereof which is identical to the opposing slots 24A' and 24B' of upper horizontal channel pieces 24A, 24B.

As can be appreciated with reference to the drawings, upstanding frame members 22A, 22B are formed from two identical metal channel pieces. Also, all four of horizontal frame members 24A, 24B and 26A, 26B are formed from identical metal channel pieces. Thus, novel rack 20 is formed from only six pieces of metal channel wherein the four horizontal pieces 24A, 24B and 26A, 26B are identical in size and the two upstanding channel pieces 22A, 22B are identical in size. Such a simplified construction results in a substantially symmetrical rack 20 which may be used in the place of conventional open and closed duct unequal flange equipment racks as well as conventional open and closed duct network bays when the appropriate accessories are attached thereto as required. For example, novel rack 20 may be inverted from the open duct configuration shown in FIG. 2 for accommodating front-wired equipment into a closed duct configuration (not shown) for accommodating rear-wired equipment by merely turning the assembly upside down. In other words, novel rack 20 may simply be turned upside down in order to be modified from a front access to a rear access telecommunications equipment mounting rack. Other universal applications of novel rack 20 would be apparent to one skilled in the telephone equipment rack art.

Figure 5:
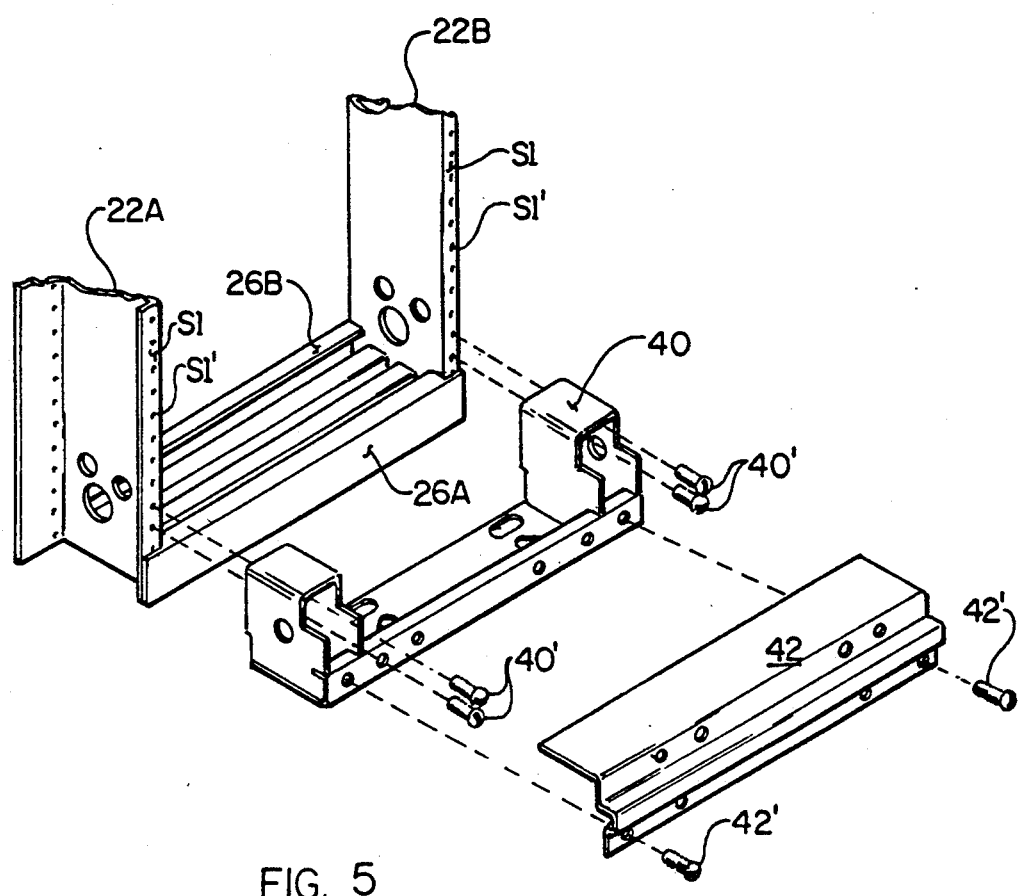
FIG. 5 is an exploded perspective view, with parts broken away for clarity, of the lower portion of the equipment rack shown in FIG. 2 and an optional guard box which may be attached thereto.
Figure 6:
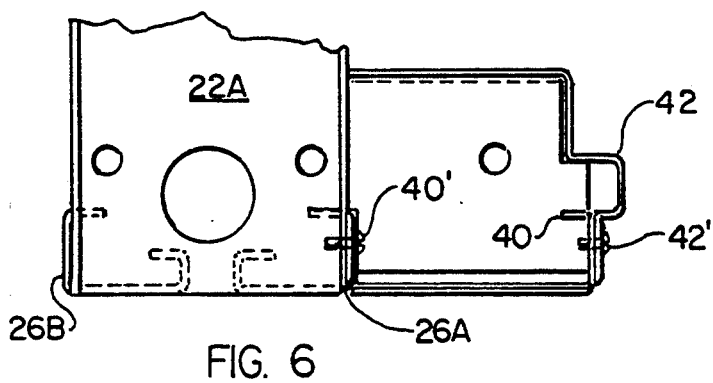
FIG. 6 is a side elevation view, with parts broken away, of the lower portion of the rack of FIG. 5 with the optional guard box attached thereto.
Figure 7:
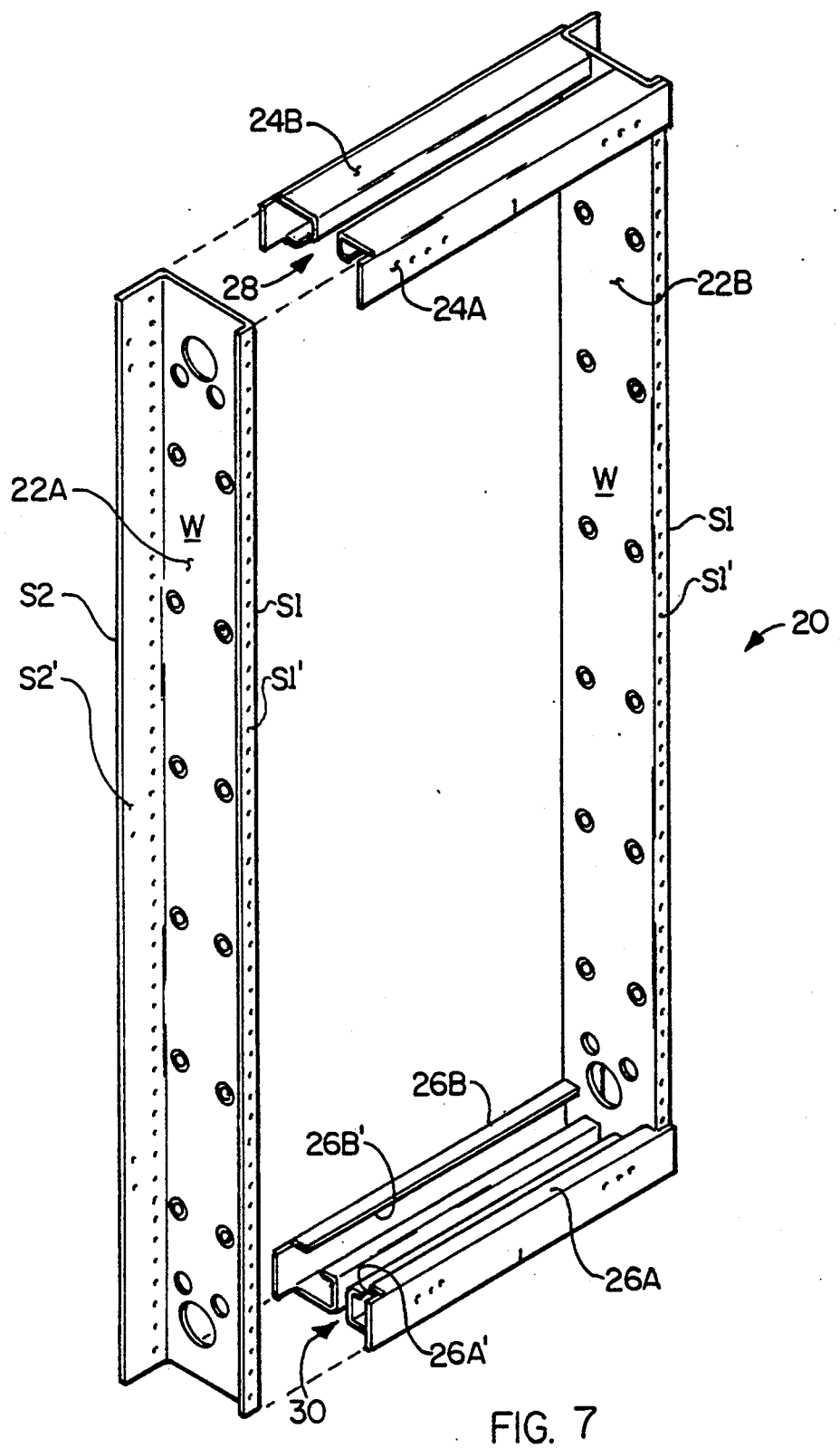
FIG. 7 is a perspective view similar to FIG. 2 but with one upstanding metal channel removed to better illustrate the construction of the rack.

Illustrative of an add-on accessory, with reference to FIGS. 5 and 6, an optional bolt-on guard box 40 and guard box cover 42 are shown which are adapted to be secured by screws 40' and 42' to apertures in the front flange of novel rack 20 and in guard box 40, respectively.

Therefore, at least the following advantageous distinctions over conventional racks are provided by novel rack 20:

1. Rack 20 can be used in lieu of open and closed duct network bays and open and closed duct unequal flange equipment racks.
2. The new and simplified shape of rack 20 provides for a rack that is strong and yet is still much lighter than previous designs so as to be cheaper to handle, store, ship and install.
3. Equipment rack inventory is reduced for both the manufacture and user of rack 20.
4. It is inexpensive and relatively easy to make upgrades and retrofits when using novel rack 20 as opposed to conventional racks which necessitate the purchase of an entirely new rack to make upgrades and retrofits.
5. Detailed advance planning and ordering is not required when installing novel rack 20 since it is interchangeable between open and closed duct applications.
6. The simplicity of design of rack 20 incorporating only two differently shaped metal channel pieces and six total metal channel pieces (four of one shape and two of another) leads to ease of construction, economies of scale in manufacturing, and improved product quality for the customer.

It will be understood that various details of the invention may be changed without departing from the scope of the invention. Furthermore, the foregoing description is for the purpose of illustration only, and not for the purpose of limitation—the invention being defined by the claims.

What is claimed is:

1. A universal invertible unequal flange-type telephone equipment rack comprising:
    a. a pair of upstanding spaced-apart frame members formed of metal channel wherein each of said frame members defines an upper and a lower end and wherein each of said metal channels further defines a U-shaped cross section comprising a web having a bottom with a relatively short side portion on one side and a relatively long side portion on the other side, said bottom and side portions of each of said metal channels being outwardly directed relative to said bottom and side portions of the other of said metal channels;
    b. a first pair of parallel and laterally spaced-apart horizontal frame members wherein each frame member is secured at opposing ends to respective upper ends of said upstanding spaced-apart frame members, said first pair of horizontal frame members defining a slot therebetween; and
    c. a second pair of parallel and laterally spaced-apart horizontal frame members wherein each frame member is secured at opposing ends to respective lower ends of said upstanding spaced-apart frame members, said second pair of horizontal frame members defining a slot therebetween;
    whereby said equipment rack may be converted from an open duct to a closed duct configuration by inverting said equipment rack and, if desired, bolting a guard box to either side of the lowermost of said first and second pair of horizontal frame members.

2. An unequal flange-type telephone equipment rack according to claim 1 wherein said pair of upstanding spaced-apart frame members consists of two substantially identical size metal channels.

3. An unequal flange-type telephone equipment rack according to claim 1 wherein said first and second pairs of horizontal frame members are secured by welding to said pair of upstanding spaced-apart frame members.

4. An unequal flange-type telephone equipment rack comprising:
    a. a pair of upstanding substantially identical size spaced-apart frame members formed of metal channel wherein each of said frame members defines an upper and a lower end and wherein each of said metal channels further defines a U-shaped cross section comprising a web having a bottom with a relatively short side portion on one side and a relatively long side portion on the other side, said bottom and side portions of each of said metal channels being outwardly directed relative to said bottom and side portions of the other of said metal channels;
    b. a first pair of identical size horizontal frame members secured at opposing ends to the upper ends of said upstanding spaced-apart frame members and being spaced-apart to define a slot therebetween, said first pair of frame members each comprising a C-shaped metal channel defining an elongate opening therein oriented downwardly toward the lower ends of said upstanding spaced-apart frame members; and
    c. a second pair of horizontal frame members secured at opposing ends to the lower ends of said upstanding spaced-apart frame members identical in size to said first paid of horizontal frame members and being spaced-apart to define a slot therebetween, said second pair of frame members each comprising a C-shaped metal channel defining an elongate opening therein oriented upwardly toward the upper ends of said upstanding spaced-apart frame members.

5. An unequal flange-type telephone equipment rack according to claim 6 wherein said first and second pairs of horizontal frame members are secured by welding to said pair of upstanding spaced-apart frame members.

6. A universal invertible unequal flange-type telephone equipment rack comprising:
   a. a pair of upstanding spaced-apart frame members formed of metal channel wherein each of said frame members defines an upper and a lower end and wherein each of said metal channels further defines a U-shaped cross section comprising a web having a bottom with a relatively short side portion on one side and a relatively long side portion on the other side, said bottom and side portions of each of said metal channels being outwardly directed relative to said bottom and side portions of the other of said metal channels;
   b. a first pair of parallel and laterally spaced-apart horizontal frame members wherein each frame member is secured at opposing ends to respective upper ends of said upstanding spaced-apart frame members, said first pair of horizontal frame members defining a slot therebetween; and
   c. a second pair of parallel and laterally spaced-apart horizontal frame members wherein each frame member is secured at opposing ends to respective lower ends of said upstanding spaced-apart frame members, said second pair of horizontal frame members defining a slot therebetween, and said first and second pair of horizontal spaced-apart frame members consisting of four substantially identical size frame members.

7. A universal invertible unequal flange-type telephone equipment rack comprising:
   a. a pair of upstanding spaced-apart frame members formed of metal channel wherein each of said frame members defines an upper and a lower end and wherein each of said metal channels further defines a U-shaped cross section comprising a web having a bottom with a relatively short side portion on one side and a relatively long side portion on the other side, said bottom and side portions of each of said metal channels being outwardly directed relative to said bottom and side portions of the other of said metal channels;
   b. a first pair of parallel and laterally spaced-apart horizontal frame members wherein each frame member is secured at opposing ends to respective upper ends of said upstanding spaced-apart frame members, said first pair of horizontal frame members defining a slot therebetween;
   c. a second pair of parallel and laterally spaced-apart horizontal frame members wherein each frame member is secured at opposing ends to respective lower ends of said upstanding spaced-apart frame members, said second pair of horizontal frame members defining a slot therebetween, and said first and second pair of horizontal spaced apart frame members consisting of four substantially identical size frame members; and
   d. wherein each of said frame members of said first and second pair of horizontal spaced-apart frame members comprises a C-shaped metal channel defining an elongate opening therein, said opening of each of said first pair of horizontal metal channels being oriented dowardwardly toward said second pair of horizontal metal channels and said opening of each of said second pair of horizontal metal channels being oriented upwardly toward said first pair of horizontal metal channels.

* * * * *